(12) United States Patent
Huang et al.

(10) Patent No.: US 10,062,772 B2
(45) Date of Patent: Aug. 28, 2018

(54) PREVENTING BRIDGE FORMATION BETWEEN REPLACEMENT GATE AND SOURCE/DRAIN REGION THROUGH STI STRUCTURE

(71) Applicant: GLOBALFOUNDRIES Inc., Grand Cayman (KY)

(72) Inventors: Haigou Huang, Rexford, NY (US); Xusheng Wu, Ballston Lake, NY (US); Xintuo Dai, Rexford, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 111 days.

(21) Appl. No.: 15/219,370

(22) Filed: Jul. 26, 2016

(65) Prior Publication Data
US 2018/0033870 A1   Feb. 1, 2018

(51) Int. Cl.
| | |
|---|---|
| H01L 21/336 | (2006.01) |
| H01L 29/66 | (2006.01) |
| H01L 29/06 | (2006.01) |
| H01L 21/28 | (2006.01) |
| H01L 21/3213 | (2006.01) |

(52) U.S. Cl.
CPC .. *H01L 29/66795* (2013.01); *H01L 21/28123* (2013.01); *H01L 21/32139* (2013.01); *H01L 29/0653* (2013.01); *H01L 29/66545* (2013.01)

(58) Field of Classification Search
CPC ........... H01L 29/66795; H01L 29/0653; H01L 29/66545; H01L 29/785; H01L 29/41791; H01L 21/28123; H01L 21/32139; H01L 21/823431; H01L 21/845; H01L 27/0886; H01L 27/1211
USPC ......................................................... 257/401
See application file for complete search history.

(56) References Cited

U.S. PATENT DOCUMENTS

| | | | | |
|---|---|---|---|---|
| 8,049,269 | B2 * | 11/2011 | Lee | ........................ H01L 27/115 257/316 |
| 8,697,536 | B1 * | 4/2014 | Cheng | ..................... H01L 29/16 438/424 |
| 8,900,941 | B2 * | 12/2014 | Cai | .................... H01L 29/66795 257/E21.409 |
| 2005/0019993 | A1 * | 1/2005 | Lee | ......................... H01L 21/84 438/157 |
| 2016/0300949 | A1 * | 10/2016 | Lee | ..................... H01L 29/7848 |

* cited by examiner

*Primary Examiner* — Kevin M Picardat
(74) *Attorney, Agent, or Firm* — Amerson Law Firm, PLLC

(57) ABSTRACT

A method includes forming at least one fin above a semiconductor substrate. An isolation structure is formed adjacent the fin. A liner layer is formed above the isolation structure adjacent an interface between the fin and the isolation structure. The liner layer includes a material different than the isolation structure. A sacrificial gate structure is formed above a portion of the fin and includes a sacrificial gate insulation layer and a sacrificial gate structure. The sacrificial gate structure is removed. The sacrificial gate insulation layer is removed selectively to the liner layer. A replacement gate structure is formed above a portion of the fin in a cavity defined by removing the sacrificial gate structure.

10 Claims, 16 Drawing Sheets

12,772 B2

PREVENTING BRIDGE FORMATION BETWEEN REPLACEMENT GATE AND SOURCE/DRAIN REGION THROUGH STI STRUCTURE

BACKGROUND OF THE INVENTION

1. Field of the Invention

The present disclosure generally relates to the fabrication of semiconductor devices, and, more particularly, to a method for preventing bridge formation between a replacement gate and a source/drain region through an STI structure.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

In some applications, fins for FinFET devices are formed such that the fin is vertically spaced apart from and above the substrate with an isolation material positioned between the fin and the substrate. FIG. 1A is a perspective view of an illustrative prior art FinFET semiconductor device 100 that is formed above a semiconductor substrate 105. In this example, the FinFET device 100 includes three illustrative fins 110, a gate electrode 115, a gate insulation layer 117, a sidewall spacer 120, and a gate cap 125. The fins 110 have a three-dimensional configuration. The portions of the fins 110 covered by the gate structure 115 is the channel region of the FinFET device 100. An isolation structure 130 is formed between the fins 110. The gate electrode 115 and gate insulation layer 117 may be sacrificial in nature in that they are later replaced (e.g., with a layer of high-k insulating material or silicon dioxide for the replacement gate insulation layer and one or more conductive material layers (e.g., metal) for the replacement gate electrode).

In a conventional process flow, additional epitaxial grown semiconductor material may be formed on the portions of the fins 110 that are positioned outside of the spacer 120. Forming the additional epi material on the fins 110 in the source/drain regions of the device reduces the resistance of source/drain regions and/or makes it easier to establish electrical contact to the source/drain regions.

FIG. 1B illustrates a cross-sectional view depicting the formation of epitaxial semiconductor material on various fins across the substrate 105, including fins for various finFET devices 100. The epitaxial material is formed in the source/drain regions of the finFET devices. The fins 110 shown in FIG. 1B are so-called densely-spaced fins. Additional so-called isolated fins 135 are illustrated representing a different region of the substrate 105 where the spacing between adjacent fins is larger. For example, the densely-spaced fins 110 may be part of a logic device or SRAM NFET, while the isolated fins 135 may be part of an SRAM PFET. During an epitaxial material growth process, the growth starts in the direction of a (111) crystallographic plane of the substrate 105. In the case of the densely-spaced fins 110, the epitaxial material can grow between the fins 110 and merge to form a substantially horizontal surface. Further growth from the horizontal surface occurs in a direction corresponding to a (100) plane of the substrate. Growth occurs much faster in a (100) plane as compared to a (111) plane, thus resulting in a merged epitaxial material structure 140 above the densely-spaced fins 110 and discrete unmerged epitaxial material structures 145 above the isolated fins 135.

Typically, a contact etch stop layer (CESL) 150 is formed above the fins 110 and merged epitaxial material structures 140, 145 to provide protection during subsequent processing, such as the formation of replacement gate structures and contacts. As evident in FIG. 1B, the CESL 150 protects the surfaces of the fins 110, the epitaxial material structures 140, 145, and the isolation structure 130. However, the region 155 of the isolation structure 130 disposed beneath the merged epitaxial material structure 140 is blocked during the deposition of the CELS 150 and, thus, is not protected.

During the replacement gate process, etch processes are employed to remove the gate electrode 115 and the gate insulation layer 117. Typically, the isolation structure 130 and the gate insulation layer 117 are both silicon dioxide. During the etch process to remove the gate insulation layer 117, a tunnel may be formed in the isolation structure 130 under the spacer 120 and erosion of the isolation structure 130 in the region 155 may occur. Such erosion may lead to defects or shorts in the completed device.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. A method includes, among other things, forming at least one fin above a semiconductor substrate. An isolation structure is formed adjacent the fin. A liner layer is formed above the isolation structure adjacent an interface between the fin and the isolation structure. The liner layer includes a material different than the isolation structure. A sacrificial gate structure is formed above a portion of the fin and includes a sacrificial gate insulation layer and a sacrificial gate structure. The sacrificial gate structure is removed. The sacrificial gate insulation layer is removed selectively to the liner layer. A replacement gate structure is formed above a portion of the fin in a cavity defined by removing the sacrificial gate structure.

Another method includes, among other things, forming a plurality of fins above a semiconductor substrate. An isolation structure is formed between the fins. A liner layer is formed above the isolation structure adjacent interfaces between the fins and the isolation structure. The liner layer includes a material different than the isolation structure. A sacrificial gate structure including a sacrificial gate insulation layer and a sacrificial gate structure is formed above portions of the fins. Epitaxial regions are formed in the fins. The epitaxial region includes a merged region disposed between at least two of the fins. A portion of the liner layer is disposed above the isolation structure beneath the merged epitaxial region. A contact etch stop layer is formed above the isolation structure and the epitaxial region. The sacrificial gate structure is removed. The sacrificial gate insulation layer is removed selectively to the liner layer. A replacement gate structure is formed in a cavity defined by removing the sacrificial gate structure.

A device includes, among other things, a plurality of fins defined above a semiconductor substrate, an isolation structure positioned between the fins and a liner layer positioned above the isolation structure adjacent interfaces between the fins and the isolation structure. The liner layer includes a material different than the isolation structure. A gate structure is positioned above portions of the fins. A merged epitaxial region is disposed between at least two of the fins. A portion of the liner layer is disposed above the isolation structure beneath the merged epitaxial region.

BRIEF DESCRIPTION OF THE DRAWINGS

The disclosure may be understood by reference to the following description taken in conjunction with the accompanying drawings, in which like reference numerals identify like elements, and in which.

Figure 1A:
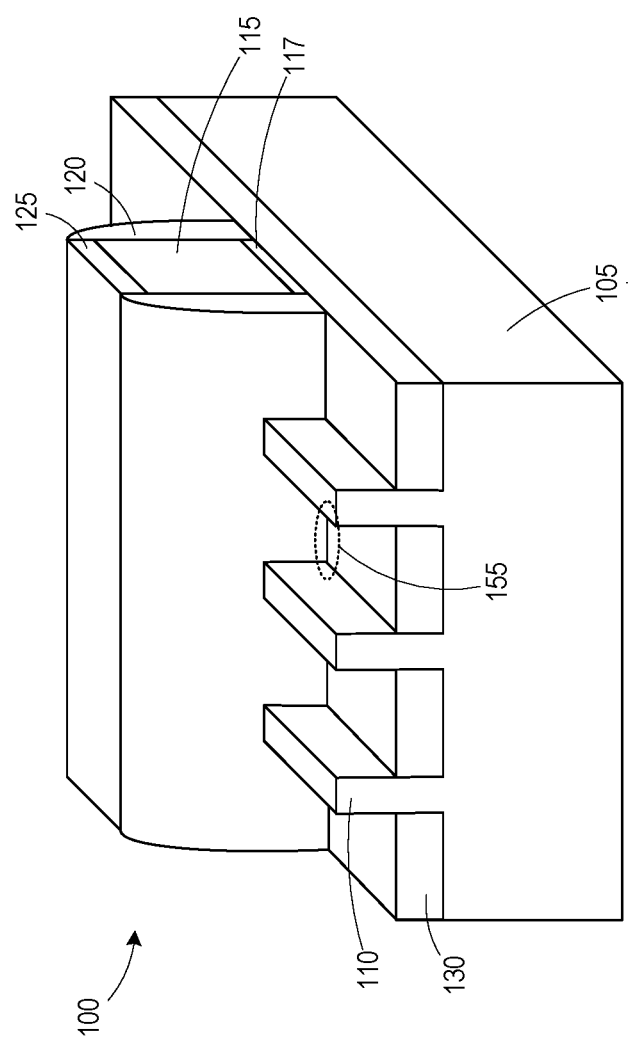
FIGS. 1A-1B schematically depict an illustrative prior art finFET device.
Figure 1B:
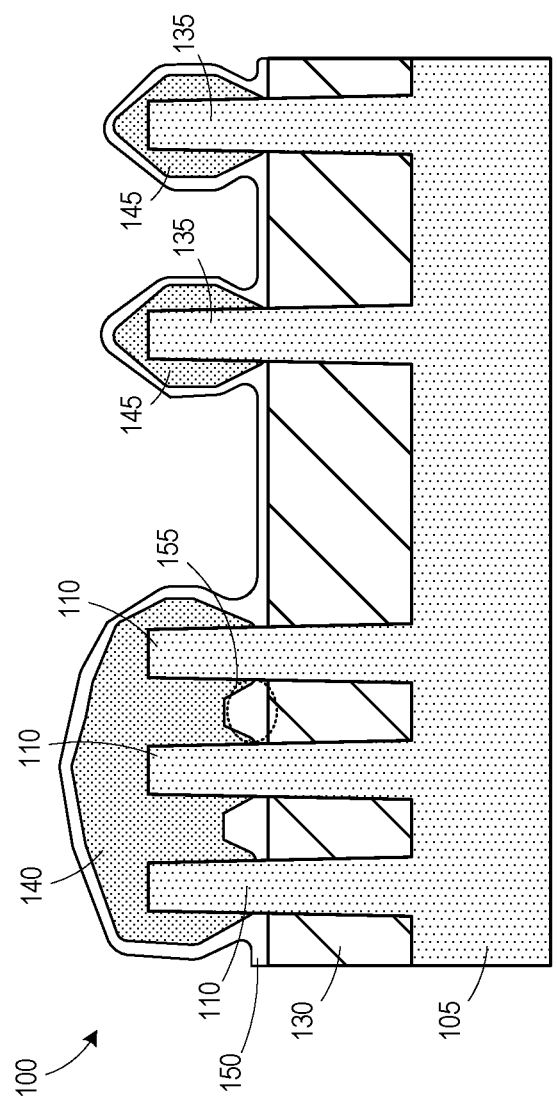

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods for preventing bridge formation between a replacement gate and a source/drain region through an STI structure when forming a finFET device and the resulting semiconductor devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 2A:
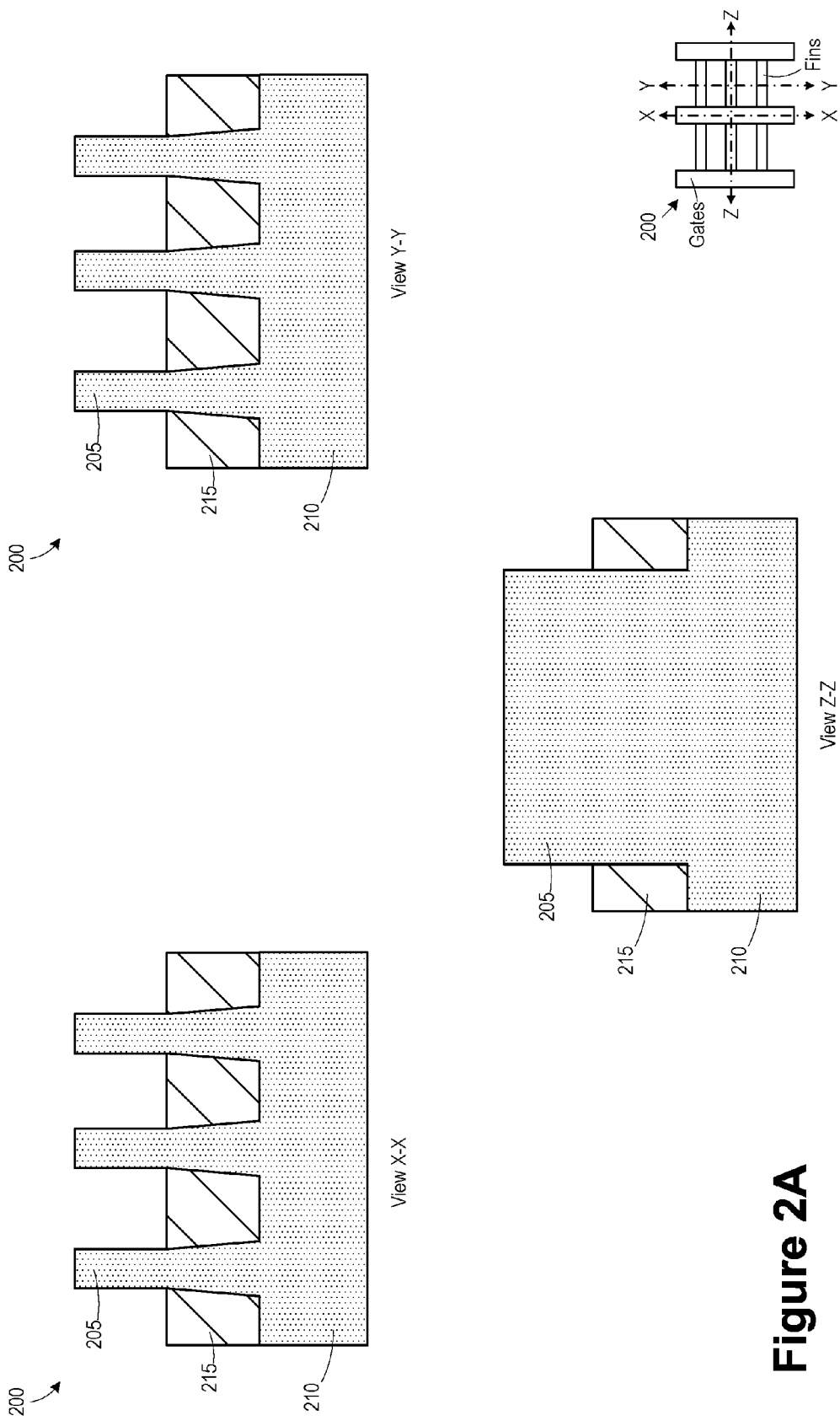
FIGS. 2A-2N depict various methods disclosed herein of forming a finFET device.
Figure 2B:
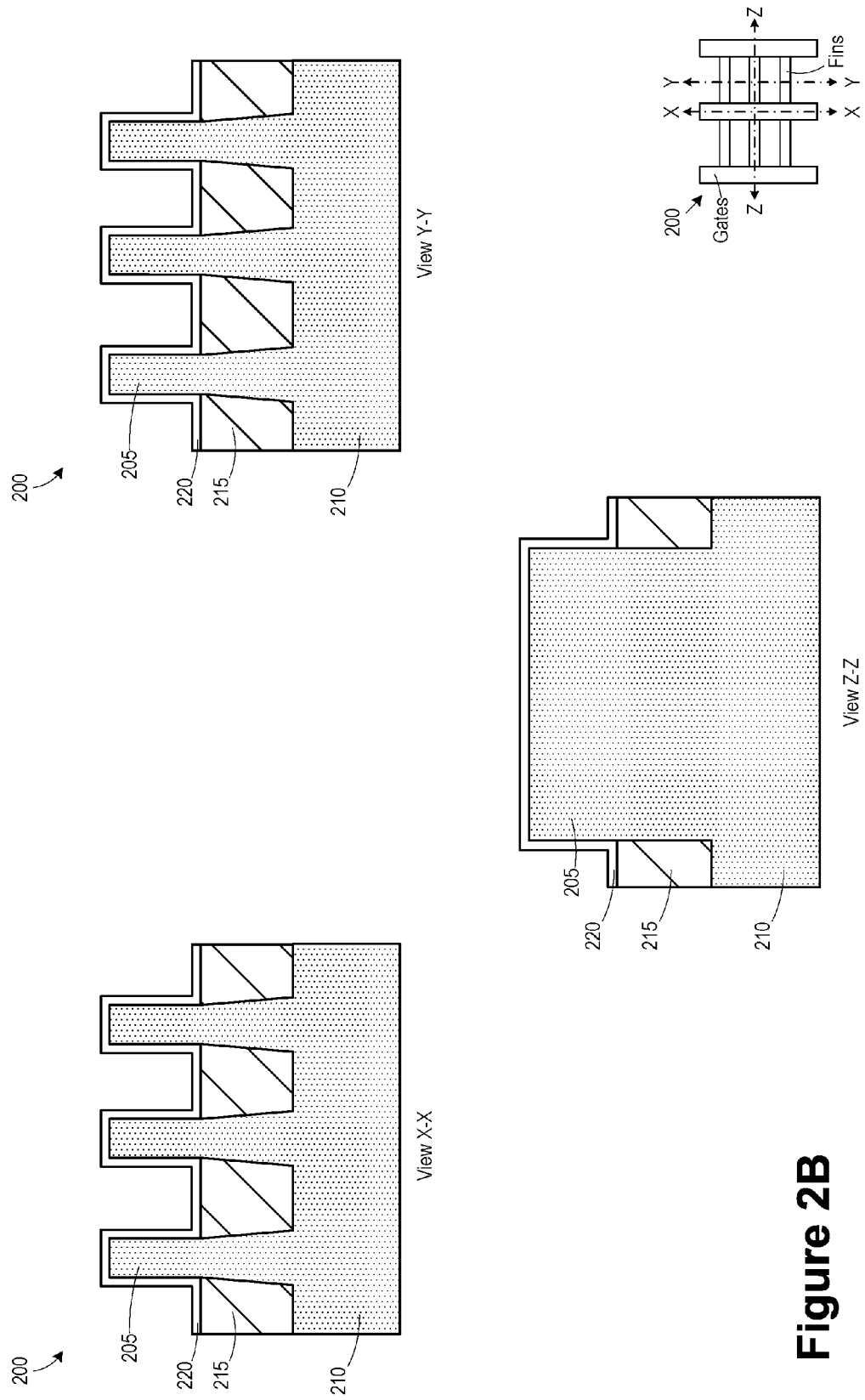
Figure 2C:
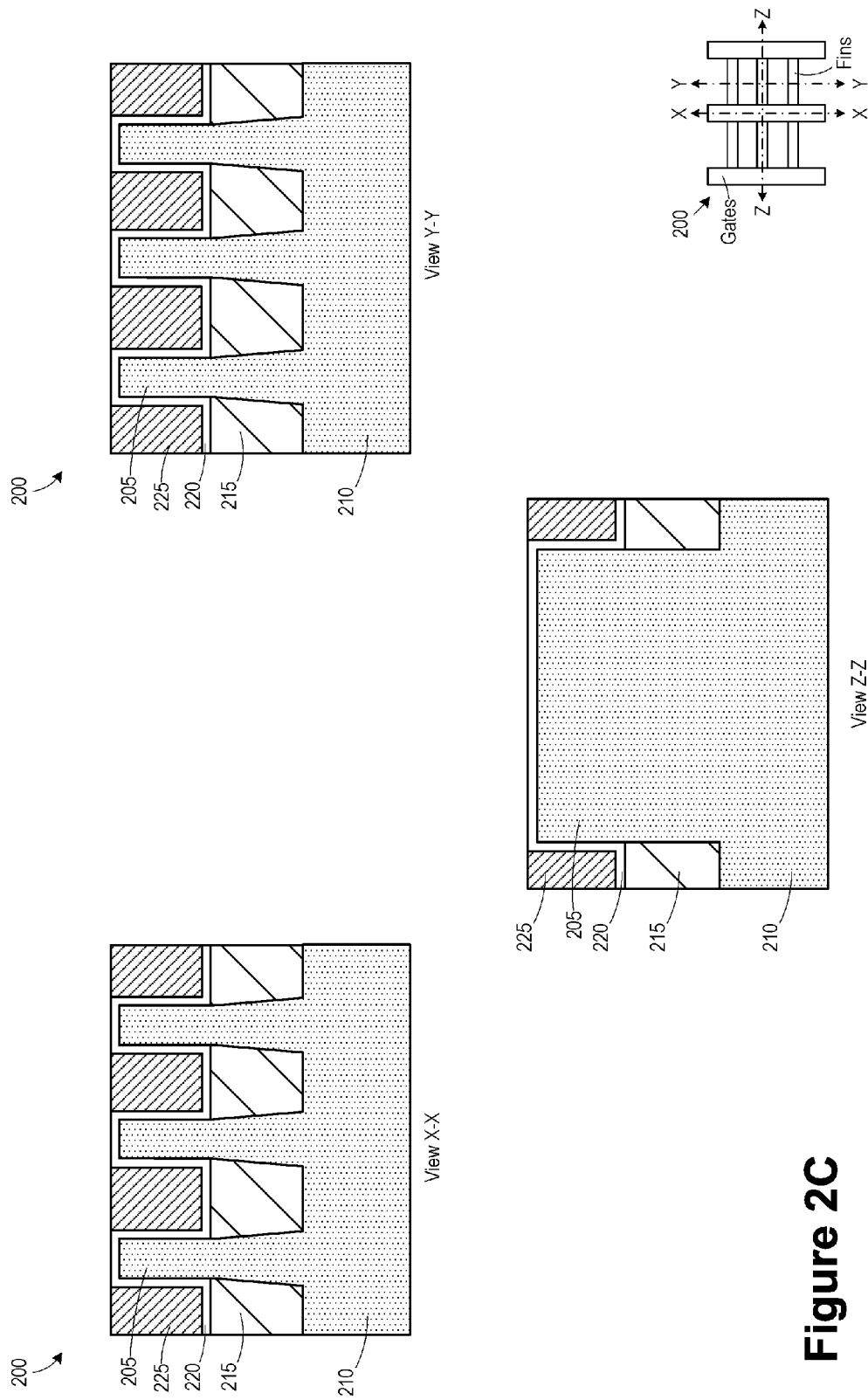
Figure 2D:
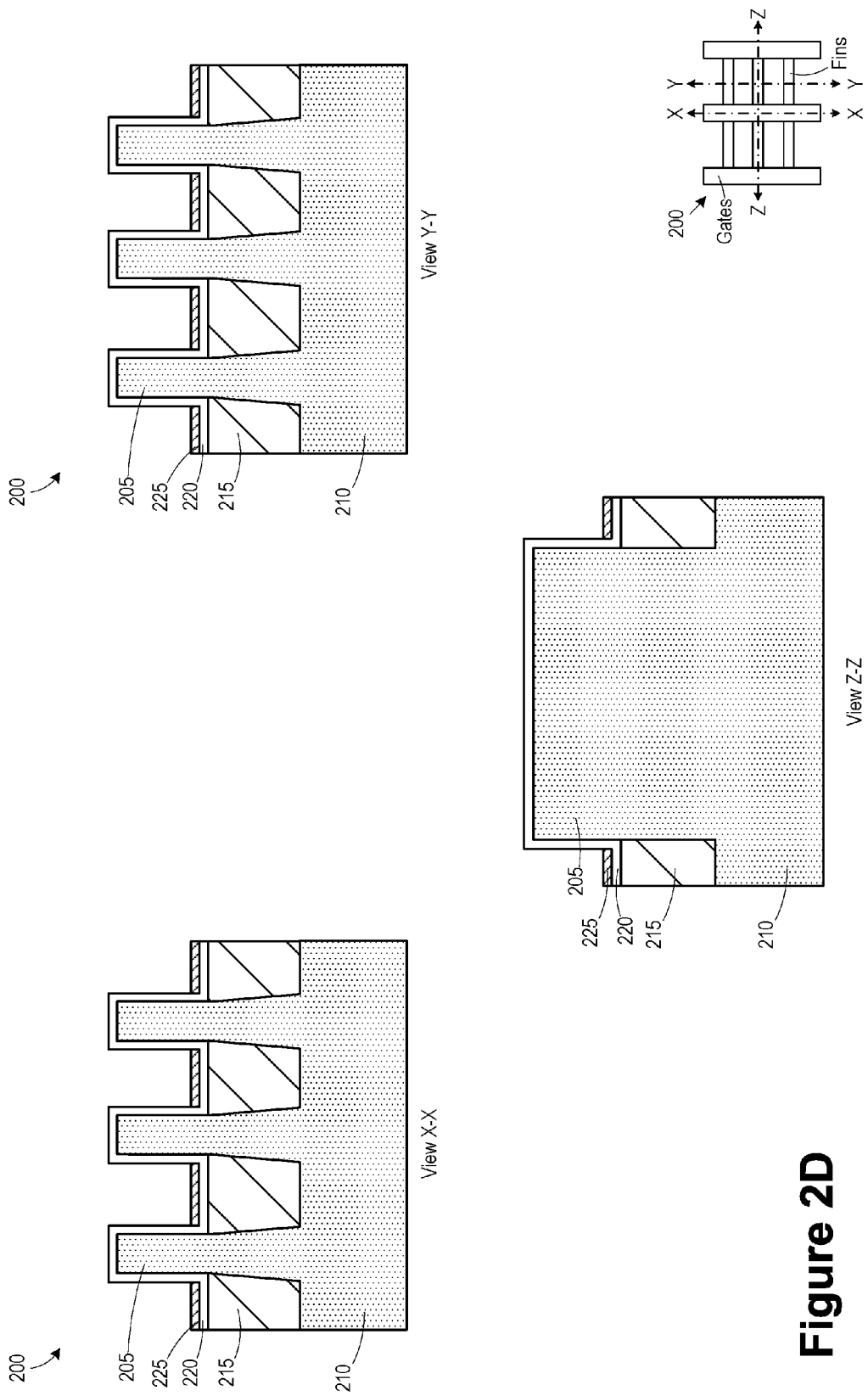
Figure 2E:
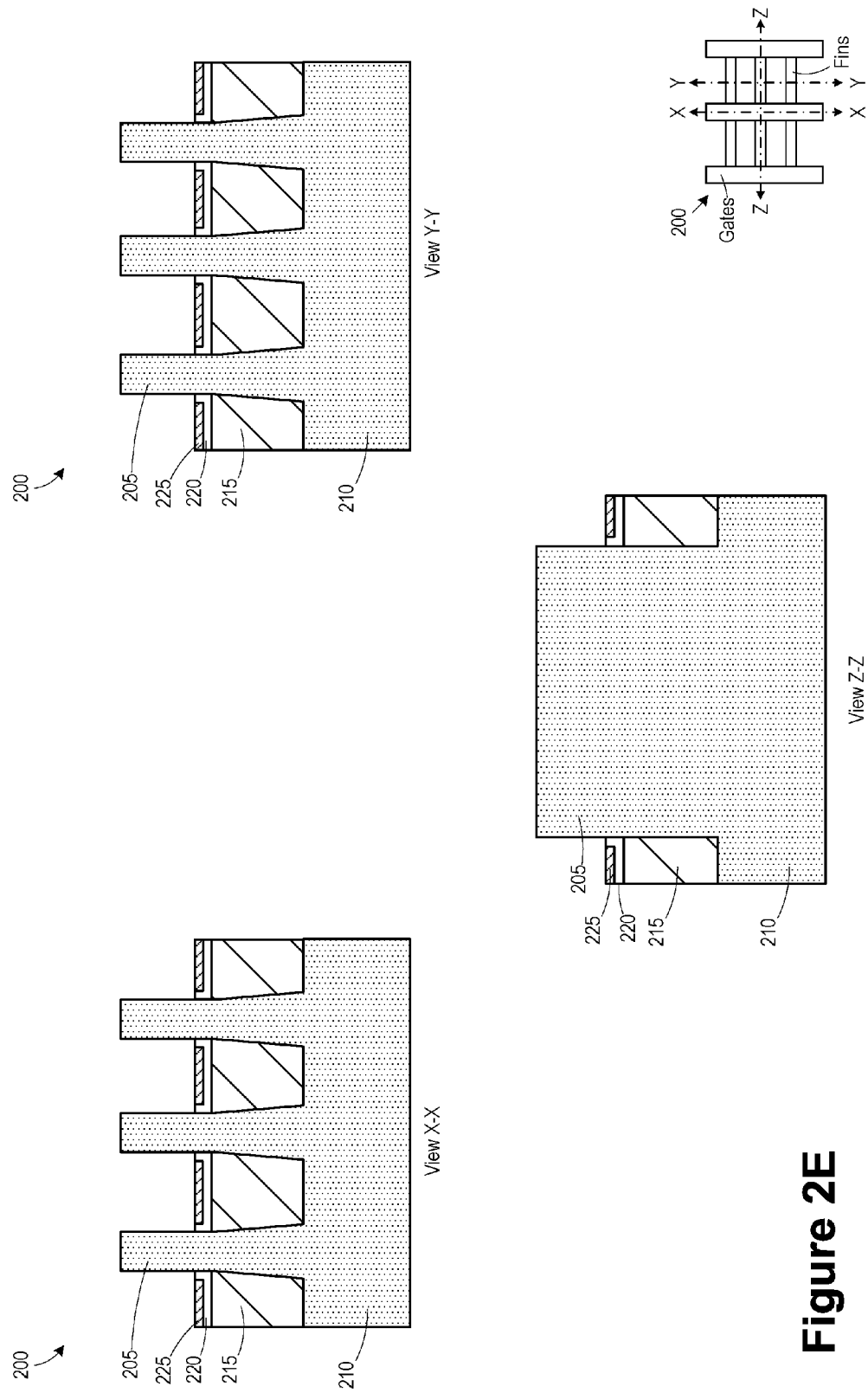
Figure 2F:
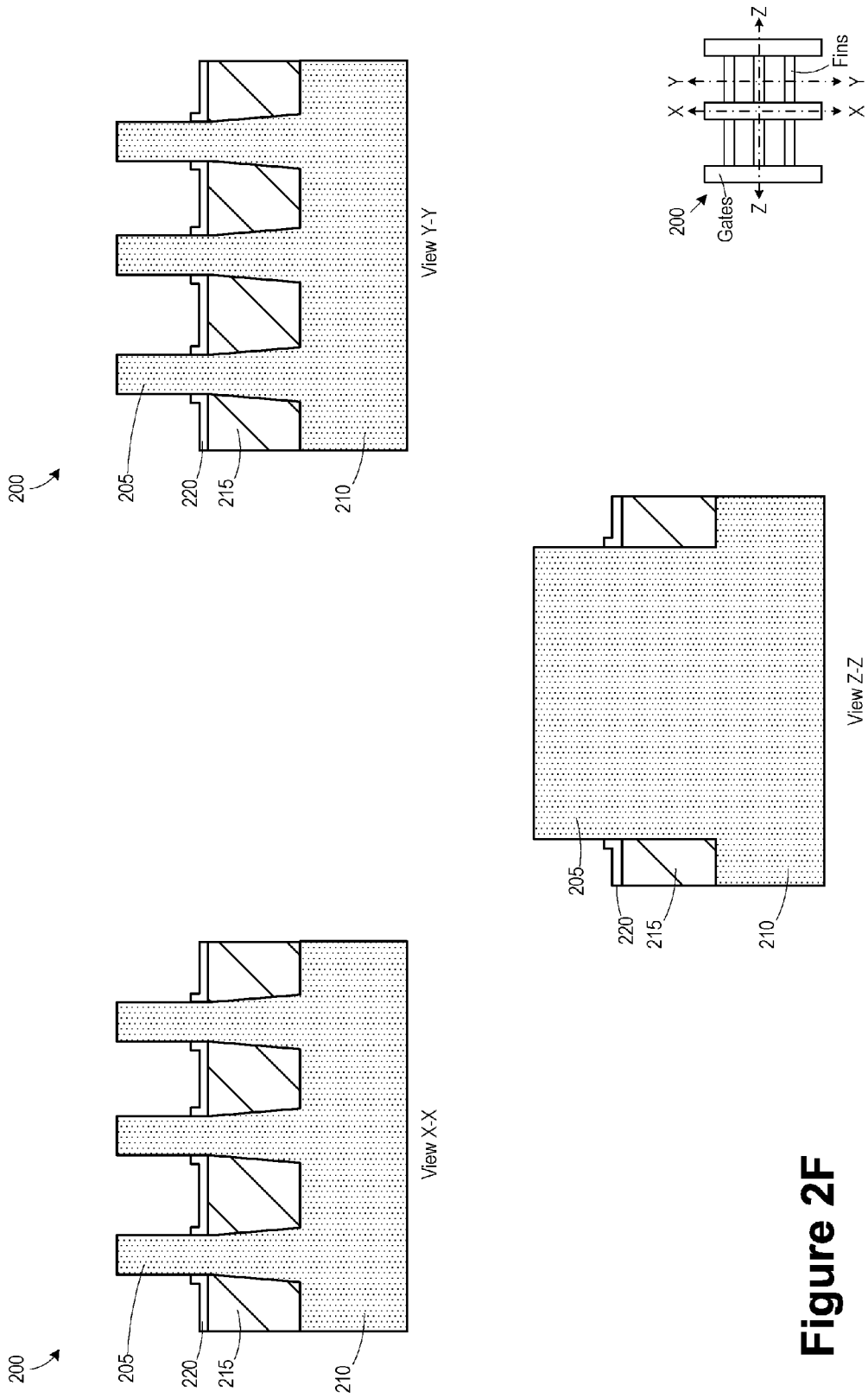
Figure 2G:
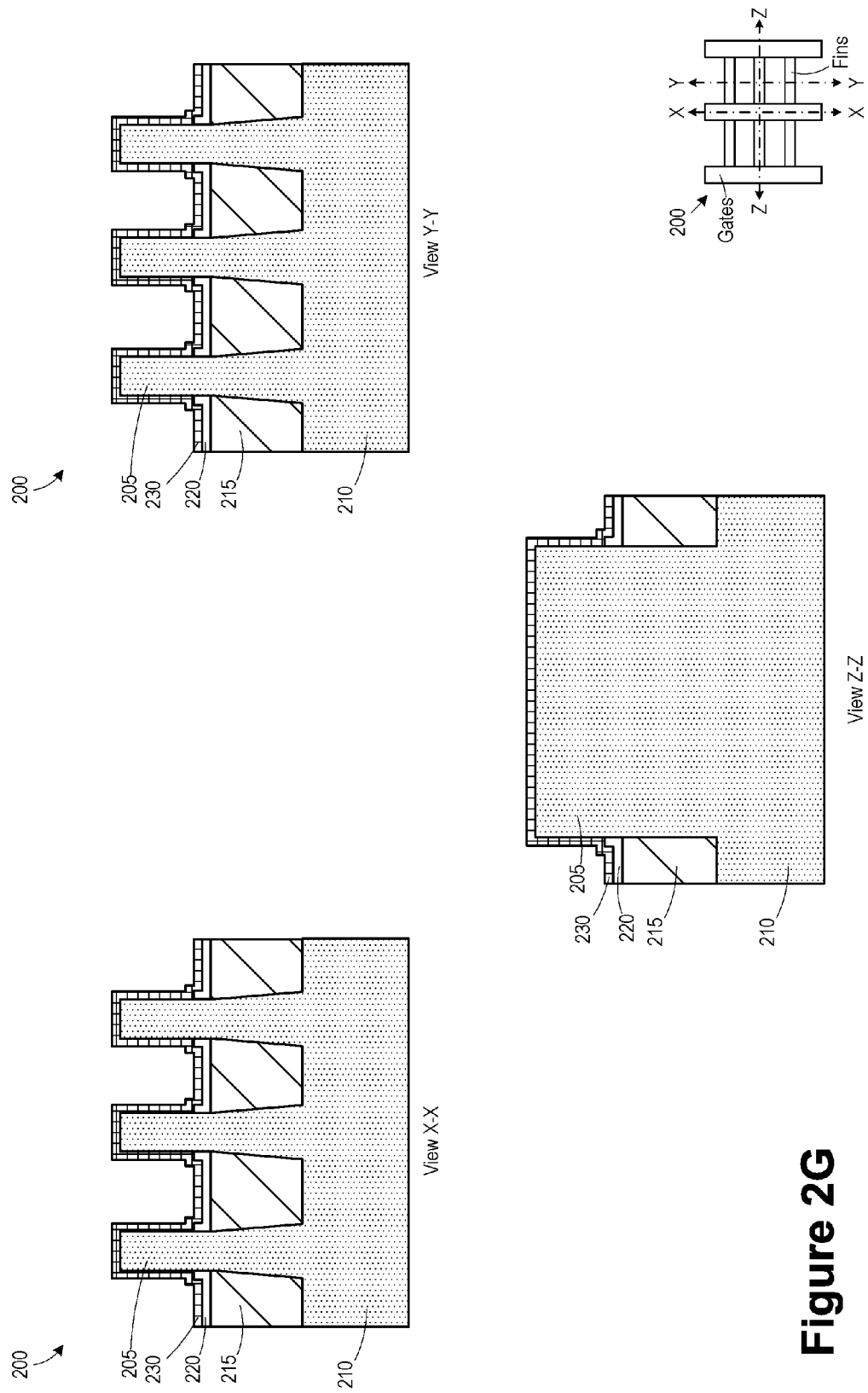
Figure 2H:
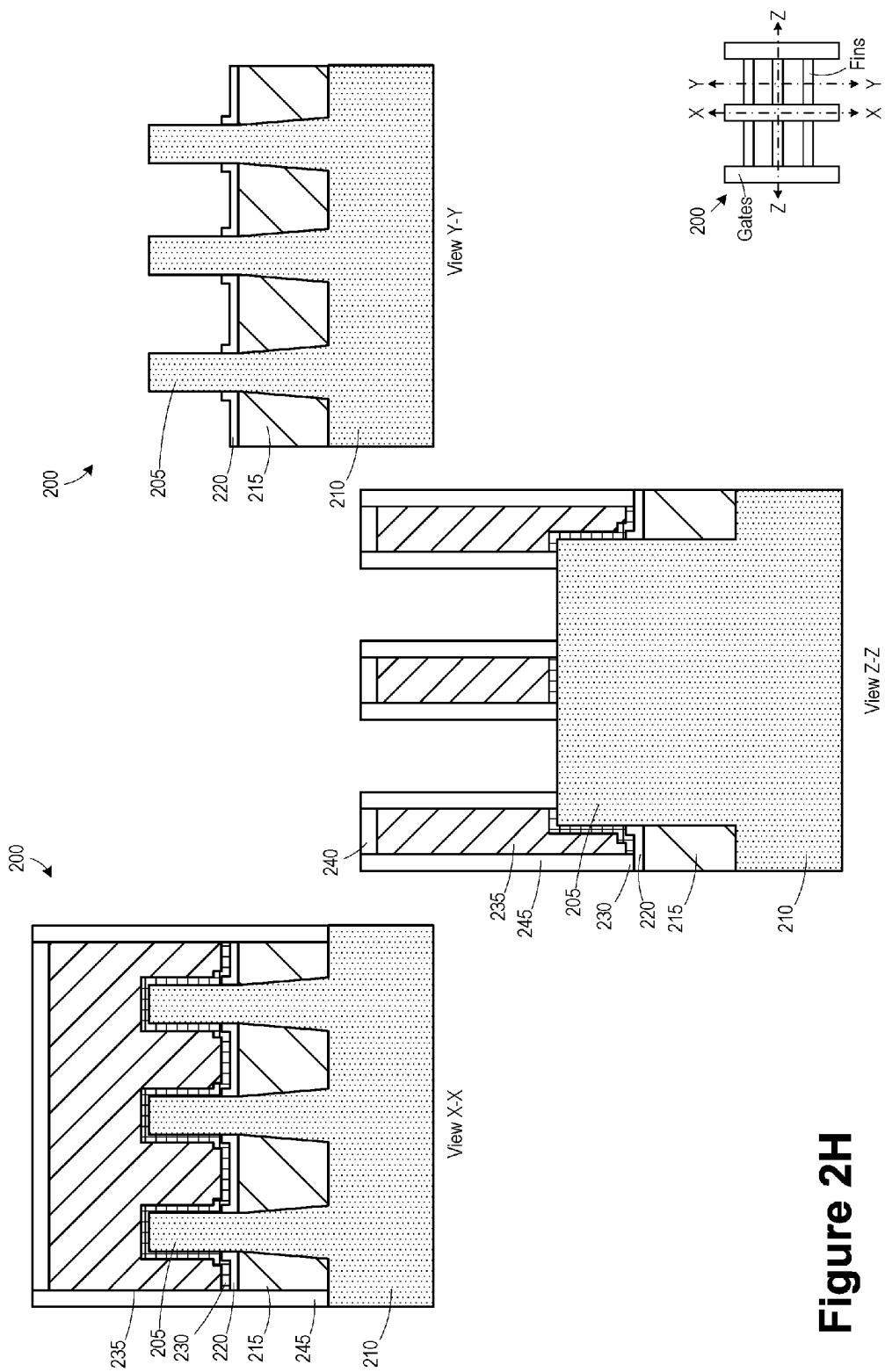
Figure 2I:
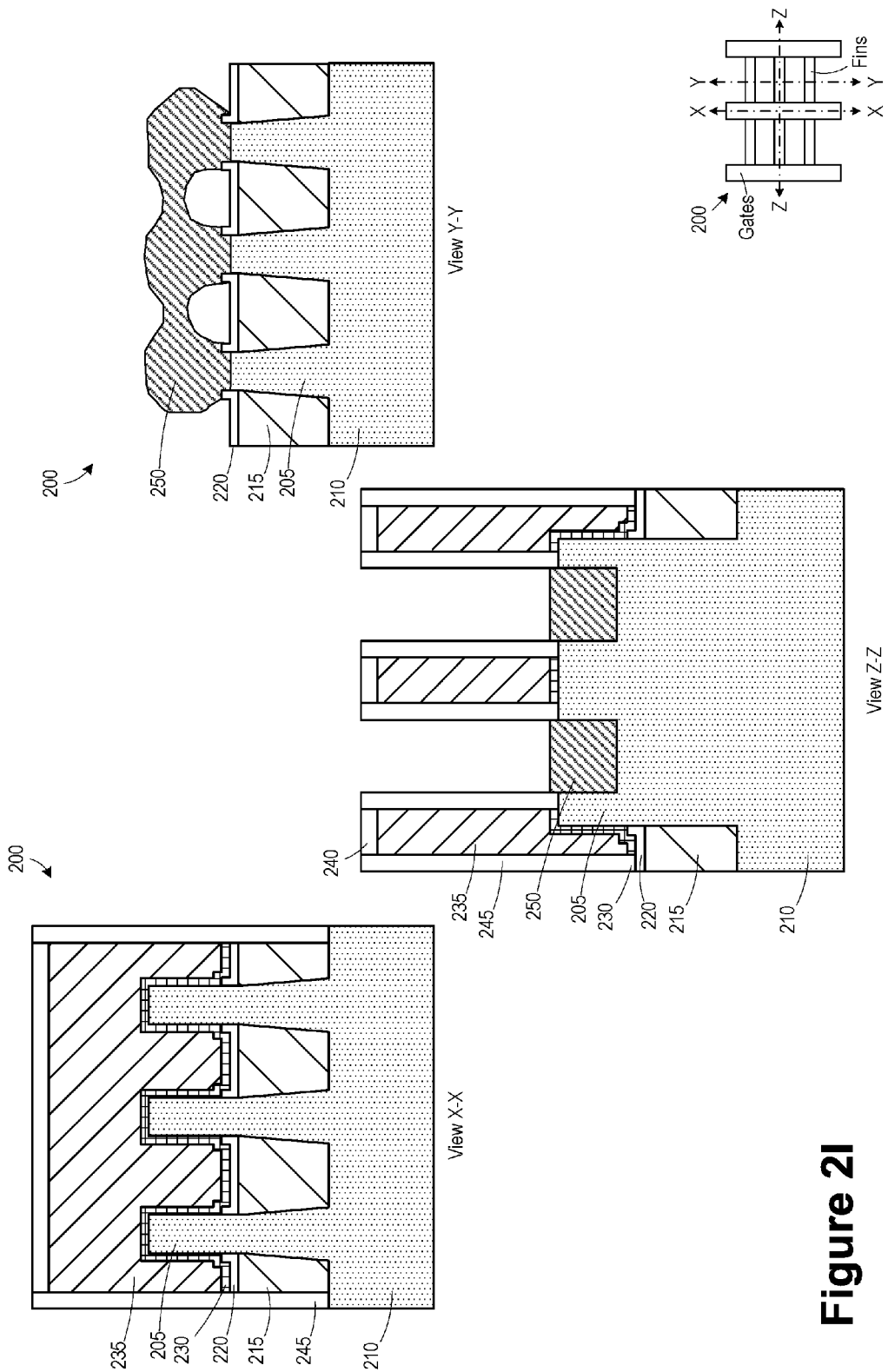
Figure 2J:
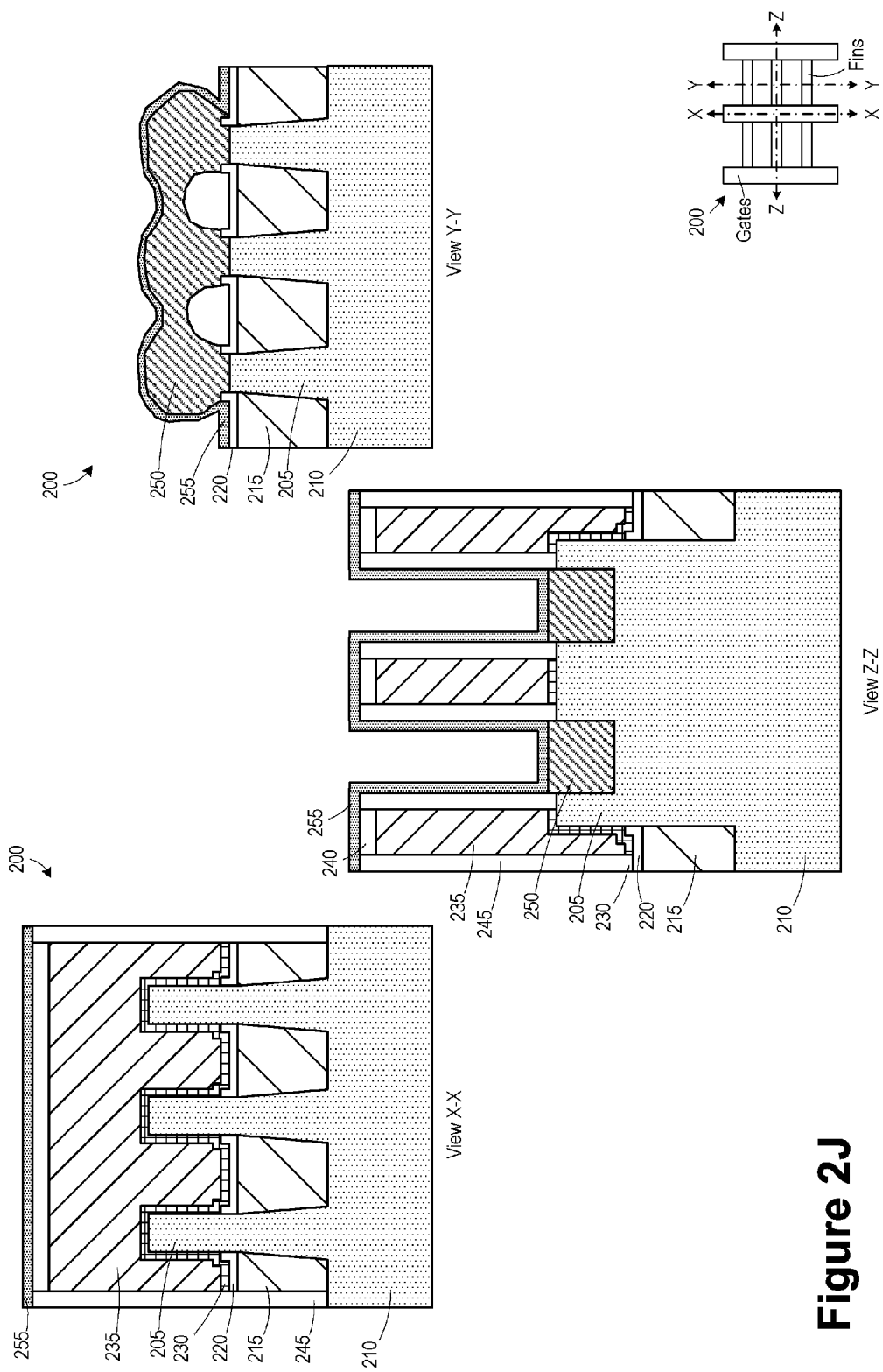
Figure 2K:
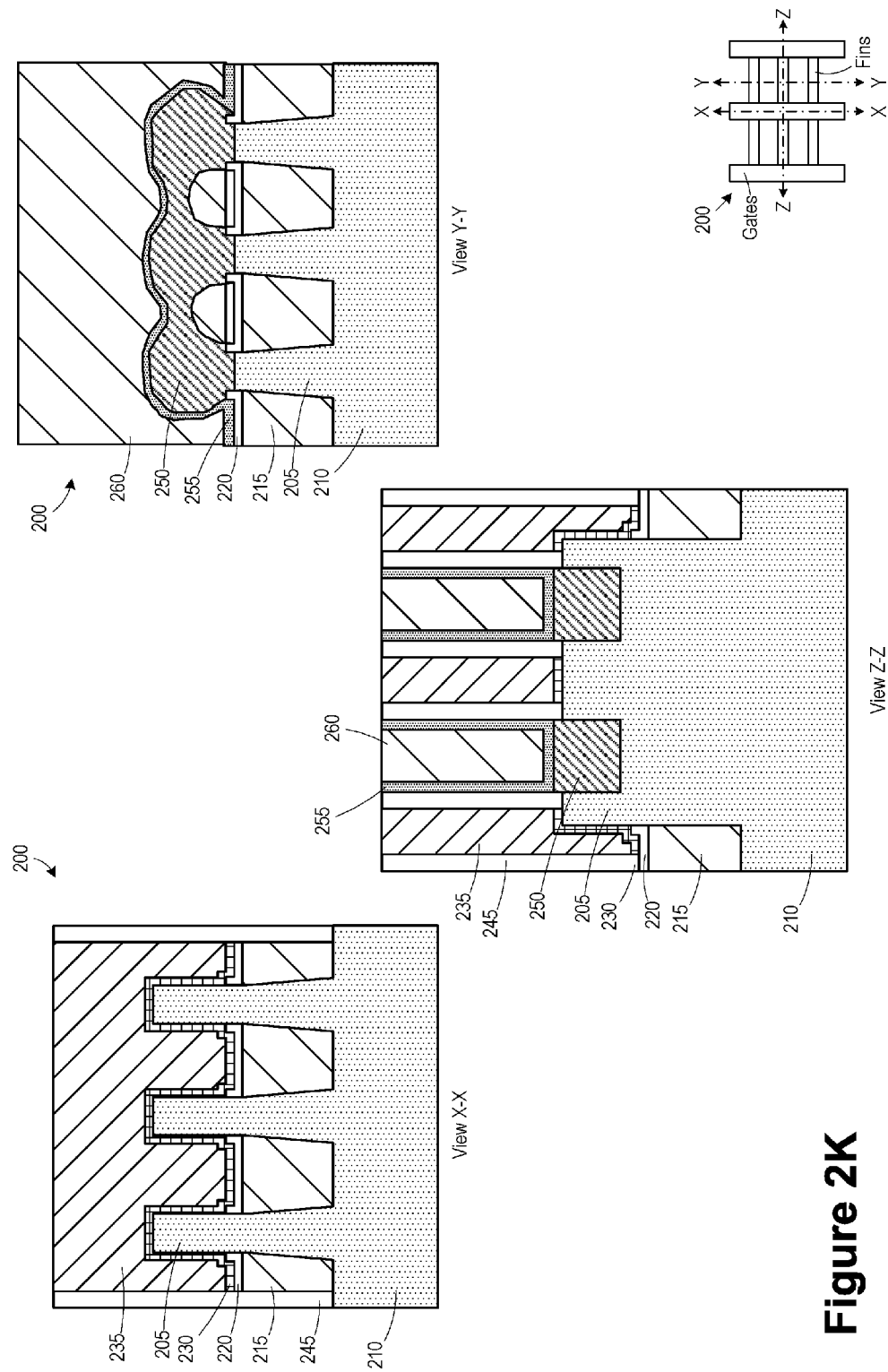
Figure 2L:
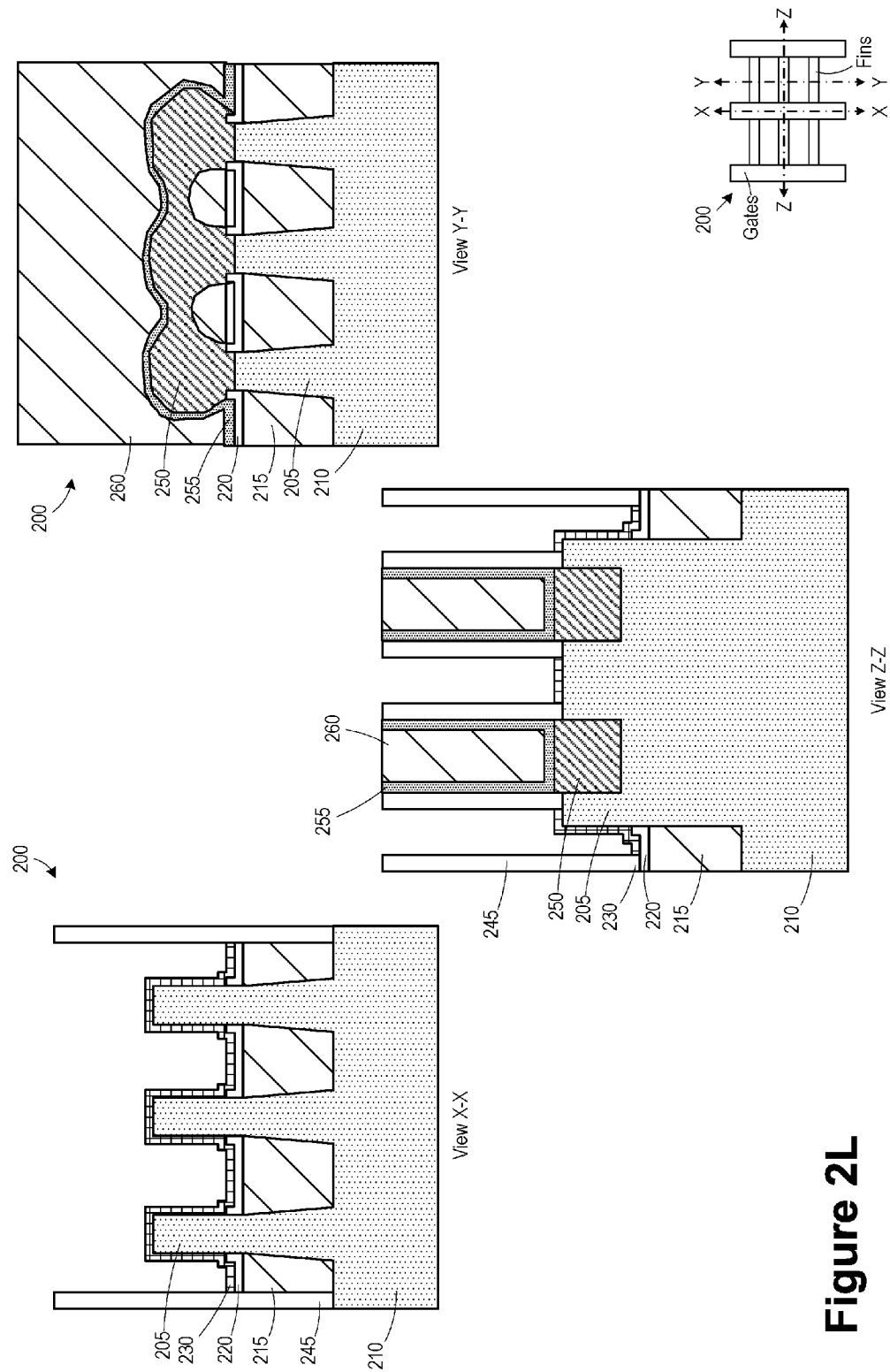
Figure 2M:
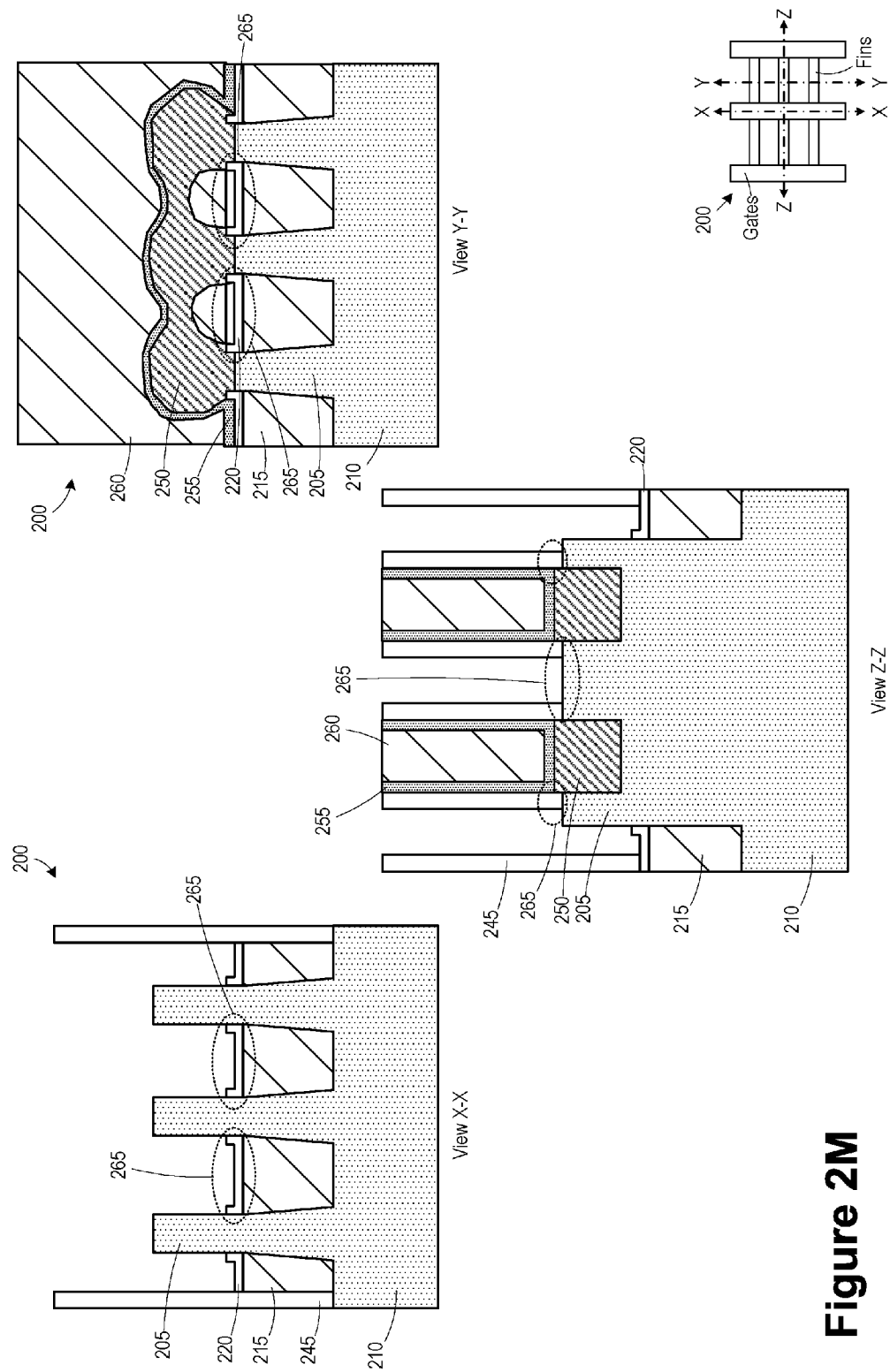
Figure 2N:
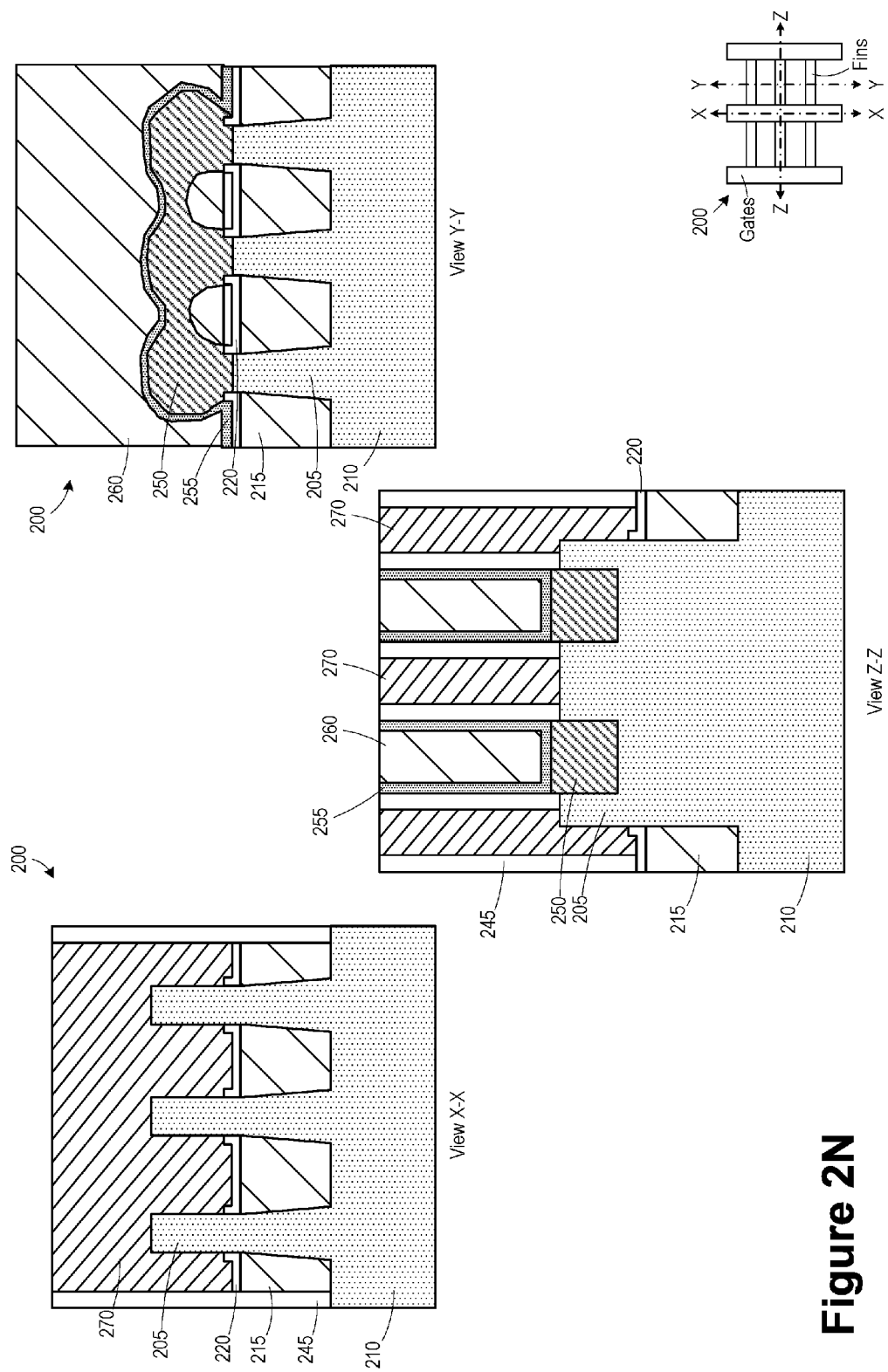

FIGS. 2A-2N illustrate various novel methods disclosed herein for forming an integrated circuit product 200. The product 200 includes fins 205 defined in a substrate 210. A recessed insulating layer (e.g., silicon dioxide) is formed between the fins 210 to serve as a shallow trench isolation (STI) structure 215.

FIGS. 2A-2N also include a simplistic plan view of the product 200 (in the lower right corner of each sheet) that depicts the location where various cross-sectional views depicted in the following drawings will be taken. More specifically, the cross-sectional view "X-X" is taken along the long axis of a gate structure (not formed yet), the cross-sectional view "Y-Y" is taken in a region between the gate structures in the same direction as view "X-X" and view "Z-Z" is taken along a long axis of a fin 205. Not all of the features illustrated in the views "X-X", "Y-Y" and "Z-Z" are replicated in the simplistic plan view.

The number of fins 205 and the spacing between the fins 205 may vary depending on the particular characteristics of the device(s) being formed. Various doped regions, e.g., halo implant regions, well regions and the like, may be formed, but are not depicted in the attached drawings. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. The substrate 210 may be formed of silicon or silicon germanium or it may be made of materials other than silicon, such as germanium. Thus, the terms "substrate" or "semiconductor substrate" should be understood to cover all semiconducting materials and all forms of such materials. The substrate 210 may have different layers. For example, the fins 205 may be formed in a process layer formed above the base layer of the substrate 210.

FIG. 2B illustrates the product 200 after a deposition process was performed to form a first liner 220 (e.g., silicon nitride) above the fins 205 and the STI structure 215. The first liner 220 covers the exposed surfaces of the fins 205 and the upper surfaces of the STI structure 215.

FIG. 2C illustrates the product 200 after a deposition process was performed to form a patterning layer 225 (e.g., silicon dioxide) above the first liner 220 and a planarization process was performed to expose the liner 220 on the top surface of the fins 205.

FIG. 2D illustrates the product 200 after an etch process was performed to recess the patterning layer 225 and expose upper portions of the liner 220.

FIG. 2E illustrates the product 200 after an etch process (e.g., wet strip) was performed to remove exposed portions of the liner 220.

FIG. 2F illustrates the product 200 after an etch process (e.g., wet strip) was performed to remove remaining portions of the patterning layer 225, thereby providing remaining portions of the liner 220 disposed on the surface of the STI structure 215 without significantly covering the sidewalls of the fins 205.

FIG. 2G illustrates the product 200 after a deposition process was performed to form a sacrificial gate oxide layer 230 (e.g., silicon dioxide) above the first liner 220 and a planarization process was performed to expose the liner 220 on the top surface of the fins 205. In some embodiments, the remaining portions of the patterning layer 225 may not be removed as they are typically the same material as the sacrificial gate oxide layer 230.

FIG. 2H illustrates the product 200 after several processes have been performed to form sacrificial gate electrodes 235. A deposition process was performed to form a sacrificial gate electrode layer (e.g., amorphous silicon) above the sacrificial gate oxide layer 230. A deposition process was performed to form a cap layer 240 above the sacrificial gate electrode layer. A patterning process was performed to pattern the sacrificial gate electrode layer using the cap layer 240 as a hard mask to define the sacrificial gate electrodes 235. A strip process was performed to remove portions of the sacrificial gate oxide layer 230 not covered by the sacrificial gate electrodes 235. A deposition process was performed to form a spacer layer (e.g., silicon nitride) above the gate electrodes 235. An etch process was performed to define the spacer 245 on sidewalls of the gate electrodes 235.

FIG. 2I illustrates the product 200 after several processes were performed. A timed selective etch process was performed to recess the fins 205. An epitaxial growth process was performed to form epitaxial material 250 on the exposed top portions of the recessed fins 205. In FIG. 2I, the epitaxial material 250 is shown as having merged in the regions between the fins 205. The likelihood of merger depends on factors such as fin pitch, epitaxial growth time, process variation, etc. In some instances, a merger might be intended. In some embodiments, a dopant may be introduced into the epitaxial material 250 while it is being formed. In some embodiments, a non-doping ion (e.g., Ge, Sn) having a covalent radius greater than silicon may also be introduced into the epitaxial material 250 to induce compressive strain on a channel region of the finFET device 200.

FIG. 2J illustrates the product 200 after a deposition process was performed to form a contact etch stop layer (CESL) 255 (e.g., silicon nitride) above the fins 205 and epitaxial material 250. In some embodiments, the CESL 255 may be a stress-inducing layer.

FIG. 2K illustrates the product 200 after a plurality of processes was performed. A deposition process was performed to form a dielectric layer 260. A planarization process was performed to expose the sacrificial gate electrodes 235.

FIG. 2L illustrates the product 200 after an etch process was performed to remove the sacrificial gate electrodes 235.

FIG. 2M illustrates the product 200 after an etch process was performed to remove the sacrificial gate dielectric layer 230. During the etch process, the liner 220 protects the regions 265 beneath the merged epitaxial material region 250 that were not covered by the CESL 255. As a result, there is no pathway for the etchant to pass under the spacer 245 and erode the STI structure 215.

FIG. 2N illustrates the product 200 after one or more deposition processes were performed to form a replacement gate structure 270 (i.e., including a gate dielectric layer (not separately shown) and a metal gate electrode (not separately shown).

Other processes may be performed to complete fabrication of the finFET device 200. Contacts and subsequent metallization layers and interconnect lines and vias may be formed. Other layers of material may be present, but are not depicted in the attached drawings.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A method, comprising:
forming at least one fin above a semiconductor substrate;
forming an isolation structure adjacent said fin;
forming a liner layer above said at least one fin and said isolation structure;
forming a dielectric layer above said liner layer;
recessing said dielectric layer to expose portions of said liner layer disposed on sidewalls of said at least one fin;
removing said exposed portions of said liner layer disposed on said sidewalls of said at least one fin;
removing remaining portions of said dielectric layer after removing said exposed portions of said liner layer, wherein a portion of said liner layer remains on an upper surface of said isolation structure adjacent an interface where said fin contacts said isolation structure after forming said isolation structure, said liner layer comprising a material different than said isolation structure;
forming a sacrificial gate structure including a sacrificial gate insulation layer and a sacrificial gate structure above a portion of said fin;
removing said sacrificial gate structure;
removing said sacrificial gate insulation layer selectively to said liner layer; and
forming a replacement gate structure in a cavity defined by removing said sacrificial gate structure.

2. The method of claim 1, wherein said isolation structure comprises silicon dioxide and said liner layer comprises silicon nitride.

3. The method of claim 1, further comprising forming a spacer adjacent said sacrificial gate structure, wherein said liner layer protects said isolation structure from an etchant used to remove said sacrificial gate insulation layer.

4. The method of claim 1, further comprising:
forming an epitaxial region in said fin after forming said sacrificial gate structure; and
forming a contact etch stop layer above said epitaxial region.

5. The method of claim 1, wherein forming said at least one fin comprises forming at least a first fin and a second fin, and the method further comprises:
forming a merged epitaxial region between said first and second fins after forming said sacrificial gate structure; and
forming a contact etch stop layer above said merged epitaxial region.

6. The method of claim 5, wherein a portion of said liner layer is disposed above said isolation structure beneath said merged epitaxial region.

7. The method of claim 6, further comprising forming a spacer adjacent said sacrificial gate structure, wherein a portion of said liner layer disposed above said isolation structure beneath said merged epitaxial region protects said isolation structure from an etchant used to remove said sacrificial gate insulation layer.

8. A method, comprising:
forming a plurality of fins above a semiconductor substrate;
forming an isolation structure between said plurality of fins;
forming a liner layer above said plurality of fins and said isolation structure;
forming a dielectric layer above said liner layer;
recessing said dielectric layer to expose portions of said liner layer disposed on sidewalls of said plurality of fins;
removing said exposed portions of said liner layer disposed on said sidewalls of said plurality of fins;
removing remaining portions of said dielectric layer after removing said exposed portions of said liner layer, wherein a portion of said liner layer remains on an upper surface of said isolation structure adjacent interfaces where said plurality of fins contact said isolation structure after forming said isolation structure, said liner layer comprising a material different than said isolation structure;
forming a sacrificial gate structure including a sacrificial gate insulation layer and a sacrificial gate structure above portions of said plurality of fins;
forming epitaxial regions in said plurality of fins, wherein said epitaxial regions include a merged region disposed between at least two of said plurality of fins, wherein a portion of said liner layer is disposed above said isolation structure beneath said merged region;
forming a contact etch stop layer above said isolation structure and said epitaxial regions;
removing said sacrificial gate structure;
removing said sacrificial gate insulation layer selectively to said liner layer; and
forming a replacement gate structure in a cavity defined by removing said sacrificial gate structure.

9. The method of claim 8, wherein said isolation structure comprises silicon dioxide and said liner layer comprises silicon nitride.

10. The method of claim 8, further comprising forming a spacer adjacent said sacrificial gate structure, wherein said portion of said liner layer disposed beneath said merged region protects said isolation structure from an etchant used to remove said sacrificial gate insulation layer.

* * * * *